United States Patent [19]
Marx
[11] 3,812,437
[45] May 21, 1974

[54] IMPEDANCE CONTROL USING TRANFERRED ELECTRON DEVICES

[75] Inventor: Richard Everet Marx, Jamesburg, N.J.

[73] Assignee: RCA Corporation, New York, N.Y.

[22] Filed: Oct. 24, 1972

[21] Appl. No.: 299,769

[52] U.S. Cl. ...................... 333/81 A, 330/5, 333/17, 333/97 S, 333/81 B
[51] Int. Cl. ............................................ H01p 1/22
[58] Field of Search .......... 333/24 G, 7 D, 17, 22 R, 333/81 A, 80 R; 330/4.9, 5; 331/107 G; 317/234 V

[56] References Cited

UNITED STATES PATENTS

| | | | |
|---|---|---|---|
| 3,349,344 | 10/1967 | Chynoweth et al. | 330/5 X |
| 3,490,051 | 1/1970 | Hakki et al. | 330/5 |
| 3,600,705 | 8/1971 | Tantraporn et al. | 330/5 X |
| 3,510,805 | 5/1570 | Sterzer | 333/7 D |

*Primary Examiner*—Paul L. Gensler
*Attorney, Agent, or Firm*—Edward J. Norton; Robert L. Troike

[57] ABSTRACT

A controllable impedance element is provided using a transferred electron device that is subcritically doped. The impedance can be used as a tunable attenuator or matching device by varying a suitable bias at the device terminals.

3 Claims, 6 Drawing Figures

IMPEDANCE CONTROL USING TRANFERRED ELECTRON DEVICES

The invention herein described was made in the course of or under a contract or subcontract thereunder with the Department of the Army.

BACKGROUND OF THE INVENTION

This invention relates to an impedance control element and more particularly to the use of transferred electron devices as a controllable impedance.

The term "transferred electron device" refers to that type of device whose operation depends on transfer of electrons heated by electric fields from high mobility to low mobility sub-bands. Such devices are now being used to provide microwave oscillators, amplifiers and mixers. For a more complete understanding of the operation of these devices refer to IEEE Transactions on Electron Devices, special issues on Semiconductor Bulk Effect and Transit-Time Devices, Vol. Ed 13, Jan. 1966 and Vol. Ed 14, Sept. 1967.

A controllable impedance element using supercritically doped N type gallium arsenide and phosphide ($GaAs_x + P_{1-x}$) was described previously by Fred Sterzer in U.S. Pat. No. 3,510,805, issued May 5, 1970. In this case the material in the active region was supercritically doped. The carrier density in the active region was about $5 \times 10^{15}$ carriers per $cm^3$ and the length of the active region was 10 microns. The term "supercritically doped" normally refers to those devices where the nL product is greater than about $5 \times 10^{11}$ $cm^{-2}$, where n is the carrier density and L is the length of the active region. In the arrangement in U.S. Pat. No. 3,510,805, the nL product is in the area of $5 \times 10^{12}$ per $cm^2$ and therefore "supercritically doped." The arrangement in the above patent exhibits negative differential mobility and can be placed across a transmission line to present a reflective mismatch in the line when at a low biasing level of 0.9 volts and an absorptive matching impedance to said line upon the application of a relatively high bias level of 4 volts.

Briefly, according to the present invention, a variable impedance control using subcritically doped transferred electron devices is provided. The device is placed across a transmission line to act as a matching element or a limiter element, for example. When the device is biased at a rather low voltage level, the device exhibits an absorptive matching impedance. At high biasing voltages, the device exhibits a low mismatching impedance.

DESCRIPTION OF A PREFERRED EMBODIMENT

A preferred embodiment of the present invention is described with the aid of the accompanying drawings wherein.

Figure 1:
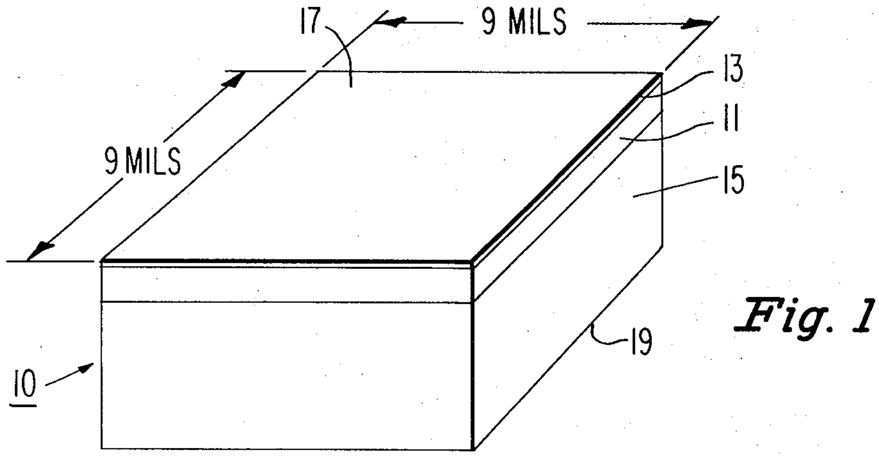
FIG. 1 is a perspective view of a transferred electron device of the type used in the present invention.
Figure 2:
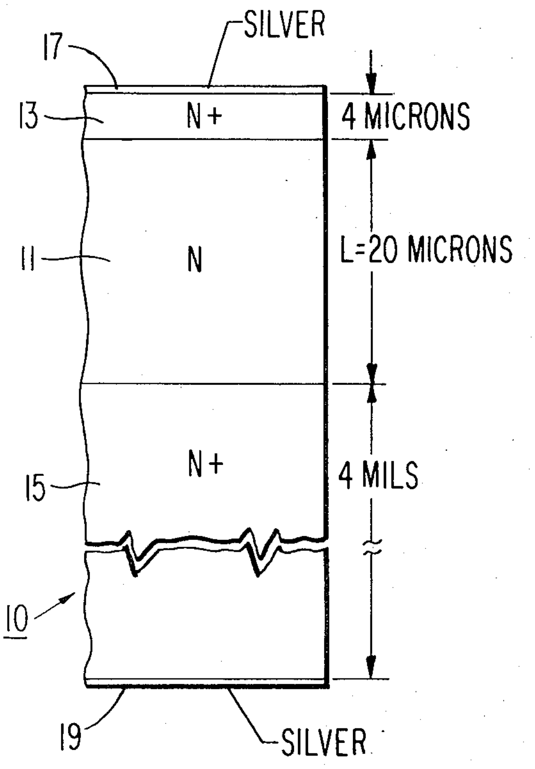
FIG. 2 is a cross section of a portion of the device of FIG. 1 illustrating the layers.

Referring to FIGS. 1 and 2, there is illustrated a transferred electron device 10 having an active region N of gallium arsenide (GaAs). The device 10 is 9 mils by 9 mils square mechanically diced from epitaxial N+—N—N+gallium arsenide sandwiches grown by the vapor hydride synthesis technique described in the following articles: Tietjen and J. A. Amick, "Preparation and Properties of Vapor Deposited Epitaxial $GaAs_{1-x}$ $GaP_x$ Using Arsenide and Phosphide," J. Electrochemical Soc. Vol. 113, pp. 724–728, July 1966 and R. E. Enstrom and C. C. Peterson "Vapor Phase Growth and Properties of GaAs Gunn Devices" Trans., Metalurgical Soc. AIME (American Institute of Metalurigical Engineers) 239 p. 413, 1967.

The device 10 includes a central active region 11 which is of N type material with a length L of 20 microns. This central region is sandwiched between two N+ layers 13 and 15 of N+ gallium arsenide. Top N+ region 13 is 4 microns and the bottom N+ region 15 is 4 mils. A layer of silver is evaporated on either end of the device 10 to provide terminals 17 and 19. The carrier density in the active region 11 is estimated about $1.3 \times 10^{14}$ $cm^{-3}$. This for an active region of 20 microns provides an nL product of $2.6 \times 10^{11}$ $cm^{-2}$. Since this is less than $5 \times 10^{11}$ $cm^{-2}$ it is therefore deemed subcritically doped material.

Figure 3:
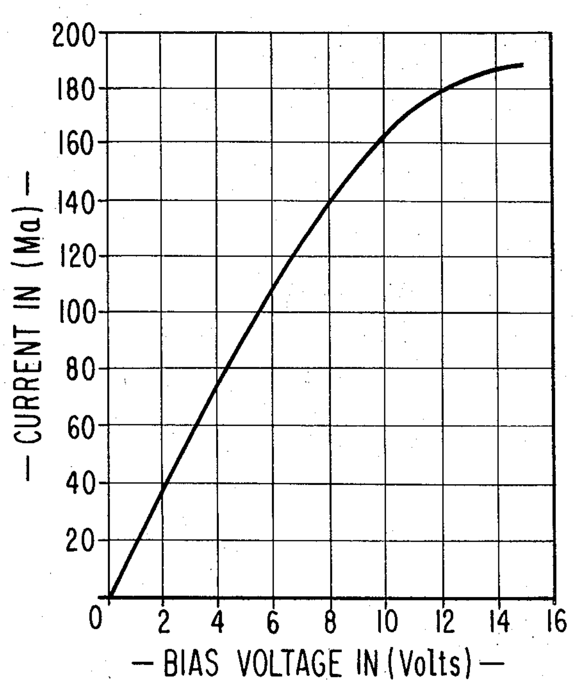
FIG. 3 is a curve illustrating a static current-voltage characteristic for a device like that shown in FIG. 1.

FIG. 3 shows a typical static current-voltage characteristic for a device as described above. The characteristic shows current saturation only. If the device were supercritically doped, a bias voltage point would be reached where it exhibits bias circuit oscillations indicating the presence of negative resistance.

Figure 4:
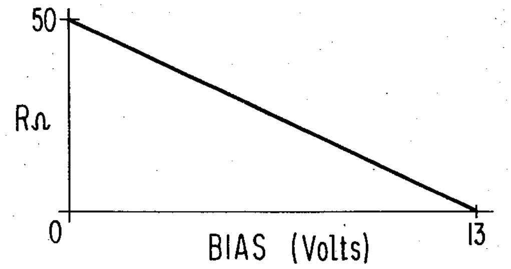
FIG. 4 is a plot of bias voltage versus resistance for a device as shown in FIG. 1.

FIG. 4 shows a plot of the device resistance versus bias voltage at 12 GHz frequency. As the bias level changes from zero volts to 13 volts the resistance changes from 50 ohms to zero ohm. This characteristic can be used in a 50 ohm transmission line to provide a variable impedance device.

Figure 5:
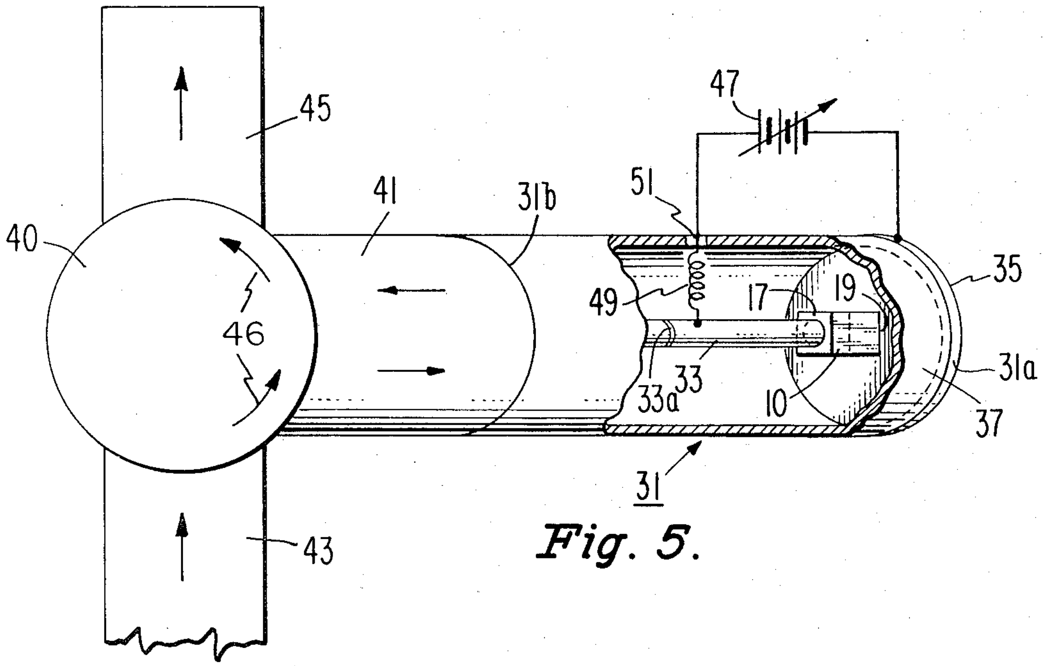
FIG. 5 is a perspective view of a device like that shown in FIG. 1 coupled in a coaxial reflection circuit.

FIG. 5 illustrates the device 10 mounted in a reflection circuit using a circulator 40. In this arrangement the device 10 is mounted in a coaxial transmission line 31 having one terminal 17 coupled to one end of the inner conductor 33 of line 31 and the opposite terminal 19 coupled to a conductive reflecting plate 35 covering one end 31*a* of the transmission line 31 and connected to the outer conductor 37. The opposite end 31*b* of the transmission line 31 is coupled to one arm 41 of a circulator 40. The input arm 43 of the circulator 40 is coupled to the input signal source, not shown, and the output from the system is taken from output arm 45. The direction of circulation is indicated by arrows 46.

The device 10 is biased by a variable d.c. bias source 47 coupled to terminal 17 of device 10 via r.f. choke coil 49 and feed through r.f. bypass capacitor 51. The opposite end of the source 47 is coupled to plate 35 which is at ground or reference potential. The variable source 47 can change the bias from zero to 13 volts. A capacitor 33*a* is formed in the inner conductor 33 to block the d.c. voltage at the source 47 from the r.f. output circuit. In this application the input power applied at arm 43 is coupled via arm 41 to line 31 and is absorbed when the bias level is about 1.65 volts and below and the resultant power output at arm 45 is zero. When the bias voltage is changed to 13 volts, the input power applied at arm 43 is coupled along arm 41 and line 31 and is reflected and essentially all of the power is coupled back through arm 41 and by circulator action to the output of arm 45.

Figure 6:
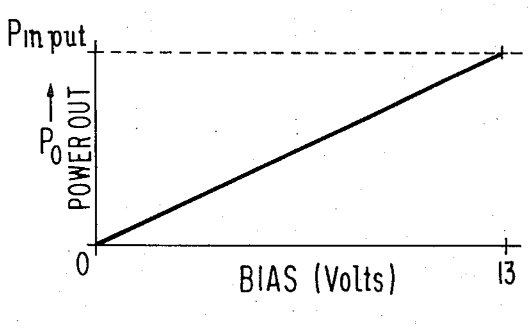
FIG. 6 is a plot of output power versus bias for the arrangement shown in FIG. 5.

The relative output power for a given bias in the arrangement of FIG. 5 is illustrated in FIG. 6. As the bias is increased from zero, the corresponding power output increases to a maximum power output that is slightly less than the power input at 13 volts. It can be seen therefore that by varying the bias between zero and 13 volts in the example given, amplitude modulation, impedance matching or variable attenuation of the signal may be provided. A simple switch may likewise be provided.

In the operation of the arrangement shown in FIG. 5, the device will match a 50 ohm line and act as an absorptive termination at 1.65 volts. When the bias voltage is at 12.98 volts, the device is a low impedance and substantially all the r.f. signal is reflected. Therefore, as the impedance of the device varies from 50 to 0 ohms due to increase in bias voltage the amount of power reflected back through the line will increase as a function of bias voltage. The following bias voltages and resistances were exhibited when the above device was tested in a 50 ohm line with a frequency swept from 11 to 12 GHz.

| Bias Voltage | Resistance |
|---|---|
| 12.98 | 0 |
| 11.55 | 10 |
| 10.05 | 20 |
| 8.35 | 30 |
| 5.24 | 40 |
| 1.65 | 50 |

What is claimed is:

1. A controllable RF signal energy absorber for use with a transmission line having a given characteristic impedance and adapted to propagate RF signal energy therealong comprising:

a transferred electron bulk semiconductor device, means for coupling said device across said transmission line, said device having an active region wherein the product of the doping density times the thickness of said region is determined by the construction of said device to cause said device to present an impedance which matches said given characteristic impedance and to present a high absorptive effect to said RF signal energy in said line upon the application of a control signal of a first low level potential at or near zero volts to said device and to present a low absorptive effect to said RF signal energy in said line upon the application of a control signal of a second significantly higher level potential to said device, means for providing said control signal which biases said device always along the positive slope of the I-V characteristic of said device, and means coupled to said last mentioned means for applying said control signal to said device.

2. The combination claimed in claim 1, wherein said product of doping density times the thickness of said active region is less than $5 \times 10^{11}$ cm$^{-2}$.

3. The combination claimed in claim 1, wherein said first level is zero volts.

* * * * *